US012769994B2

(12) United States Patent
Choi et al.

(10) Patent No.: US 12,769,994 B2
(45) Date of Patent: Oct. 20, 2026

(54) 3D NEUROMORPHIC SYSTEM AND OPERATING METHOD THEREOF

(71) Applicants: IUCF-HYU (INDUSTRY-UNIVERSITY COOPERATION FOUNDATION HANYANG UNIVERSITY), Seoul (KR); RESEARCH & BUSINESS FOUNDATION SUNGKYUNKWAN UNIVERSITY, Suwon-si (KR)

(72) Inventors: Chang Hwan Choi, Seoul (KR); Yoonmyung Lee, Suwon-si (KR); Yu Rim Jeon, Seoul (KR); Dong Uk Seo, Suwon-si (KR)

(73) Assignees: IUCF-HYU (INDUSTRY-UNIVERSITY COOPERATION FOUNDATION HANYANG UNIVERSITY), Seoul (KR); RESEARCH & BUSINESS FOUNDATION SUNGKYUNKWAN UNIVERSITY, Suwon-si (KR)

( * ) Notice: Subject to any disclaimer, the term of this patent is extended or adjusted under 35 U.S.C. 154(b) by 474 days.

(21) Appl. No.: 18/570,304

(22) PCT Filed: Jun. 22, 2022

(86) PCT No.: PCT/KR2022/008835
§ 371 (c)(1),
(2) Date: Dec. 14, 2023

(87) PCT Pub. No.: WO2022/270890
PCT Pub. Date: Dec. 29, 2022

(65) Prior Publication Data

US 2024/0265247 A1 Aug. 8, 2024

(30) Foreign Application Priority Data

Jun. 24, 2021 (KR) ........................ 10-2021-0082091

(51) Int. Cl.
*G06N 3/065* (2023.01)
*G11C 11/54* (2006.01)
(Continued)

(52) U.S. Cl.
CPC .............. *G06N 3/065* (2023.01); *G11C 11/54* (2013.01); *H10B 63/84* (2023.02);
(Continued)

(58) Field of Classification Search
CPC ...................................................... G06N 3/065
See application file for complete search history.

(56) References Cited

U.S. PATENT DOCUMENTS 9,208,434 B2 * 12/2015 Suri ....................... G06N 3/049
9,275,328 B1 * 3/2016 Minkovich ............ G06N 3/088
(Continued)

FOREIGN PATENT DOCUMENTS

KR 10-2006-0105358 A 10/2006
KR 10-2018-0035251 A 4/2018
(Continued)

OTHER PUBLICATIONS

International Search Report for PCT/KR2022/008835 dated Dec. 1, 2022 (PCT/ISA/210).

*Primary Examiner* — David E Choi
(74) *Attorney, Agent, or Firm* — Sughrue Mion, PLLC

(57) ABSTRACT

Disclosed is a technology of independently connecting a plurality of neuromorphic elements three-dimensionally laminated on a Complementary Metal-Oxide Semiconductor (CMOS) wafer through an interconnection layer and selectively driving and testing the plural neuromorphic elements with pulses generated and transmitted from the CMOS wafer. More particularly, the 3D neuromorphic system implemented on a Complementary Metal-Oxide Semiconductor (CMOS) wafer, the 3D neuromorphic system includ-
(Continued)

610 ing: an element array including a plurality of neuromorphic elements respectively and independently connected to a plurality of interconnection layers formed on the Complementary Metal-Oxide Semiconductor (CMOS) wafer; a synaptic pulse generator configured to generate at least one synaptic pulse to generate synaptic characteristics in the plural neuromorphic elements; and a controller configured to generate a control signal for controlling generation of the at least one synaptic pulse and to control the at least one synaptic pulse generated in the plural neuromorphic elements to sequentially applied.

16 Claims, 15 Drawing Sheets

(51) Int. Cl.
*H10B 63/00* (2023.01)
*H10N 70/00* (2023.01)
*H10W 20/41* (2026.01)

(52) U.S. Cl.
CPC ....... *H10N 70/841* (2023.02); *H10N 70/8833* (2023.02); *H10W 20/435* (2026.01)

(56) References Cited

U.S. PATENT DOCUMENTS

| | | | | |
|---|---|---|---|---|
| 9,940,574 | B1 * | 4/2018 | Thibeault | G06N 3/049 |
| 10,445,640 | B1 * | 10/2019 | Ito | G06N 3/063 |
| 11,093,823 | B2 * | 8/2021 | Lee | G06N 3/063 |
| 11,205,117 | B2 * | 12/2021 | Kim | G06N 3/048 |
| 11,468,307 | B2 * | 10/2022 | Lam | G06N 3/049 |
| 11,580,370 | B2 * | 2/2023 | Lam | G11C 13/0004 |
| 2012/0109864 | A1 * | 5/2012 | Modha | G06N 3/063 706/25 |
| 2014/0172762 | A1 * | 6/2014 | Suri | G06N 3/049 706/25 |
| 2014/0365416 | A1 * | 12/2014 | Kim | G11C 11/412 706/26 |
| 2015/0088797 | A1 * | 3/2015 | Kim | G06N 3/049 706/29 |
| 2016/0125287 | A1 * | 5/2016 | Pantazi | G11C 11/54 706/26 |
| 2016/0203400 | A1 * | 7/2016 | Kim | G06N 3/063 706/27 |
| 2016/0267379 | A1 * | 9/2016 | Eleftheriou | G06N 3/049 |
| 2016/0350643 | A1 * | 12/2016 | Hosokawa | G06N 3/088 |
| 2017/0193353 | A1 * | 7/2017 | Lee | G06N 3/049 |
| 2017/0193358 | A1 * | 7/2017 | Lee | G06N 3/049 |
| 2017/0193364 | A1 * | 7/2017 | Lee | G06N 3/063 |
| 2017/0300806 | A1 * | 10/2017 | Lee | G06N 3/049 |
| 2017/0364801 | A1 * | 12/2017 | Kim | G06N 3/049 |
| 2017/0372194 | A1 * | 12/2017 | Pantazi | G06N 3/063 |
| 2018/0107922 | A1 * | 4/2018 | Paul | G06N 20/00 |
| 2018/0129932 | A1 * | 5/2018 | Lee | G06N 3/049 |
| 2018/0232628 | A1 * | 8/2018 | Park | G06N 3/0499 |
| 2018/0240009 | A1 * | 8/2018 | Lee | G06N 3/049 |
| 2018/0285721 | A1 * | 10/2018 | Lee | G06N 3/065 |
| 2018/0300612 | A1 * | 10/2018 | Lee | G06N 3/049 |
| 2018/0314929 | A1 * | 11/2018 | Lee | G06N 3/048 |
| 2019/0026627 | A1 * | 1/2019 | Hatcher | G06N 3/0495 |
| 2019/0228287 | A1 * | 7/2019 | Okazaki | G06N 3/065 |
| 2019/0294958 | A1 * | 9/2019 | Kim | G06N 3/049 |
| 2019/0311263 | A1 * | 10/2019 | Kendall | G06N 3/08 |
| 2019/0318242 | A1 * | 10/2019 | Kendall | G06N 3/08 |
| 2019/0326387 | A1 | 10/2019 | Frank et al. | |
| 2019/0354843 | A1 * | 11/2019 | Park | G06N 3/063 |
| 2020/0050928 | A1 * | 2/2020 | Narayanan | G06N 3/065 |
| 2020/0074286 | A1 * | 3/2020 | Kim | G06F 7/501 |
| 2020/0202206 | A1 * | 6/2020 | Rummens | G06N 3/049 |
| 2021/0183438 | A1 * | 6/2021 | Lee | G11C 11/54 |
| 2021/0319293 | A1 * | 10/2021 | Lee | G06N 3/04 |
| 2021/0406651 | A1 * | 12/2021 | Lam | G06N 3/065 |
| 2021/0406658 | A1 * | 12/2021 | Lam | H03K 5/2472 |
| 2022/0058473 | A1 * | 2/2022 | Park | G06N 3/049 |
| 2022/0076108 | A1 * | 3/2022 | Park | H10B 61/00 |
| 2023/0048278 | A1 * | 2/2023 | Noh | G11C 13/004 |
| 2023/0122192 | A1 * | 4/2023 | Shah | G06N 3/049 706/25 |
| 2023/0135011 | A1 * | 5/2023 | Park | G06N 3/049 706/26 |
| 2023/0153588 | A1 * | 5/2023 | Park | G06N 3/049 706/27 |
| 2023/0162014 | A1 * | 5/2023 | Park | G06N 3/063 706/25 |
| 2023/0177322 | A1 * | 6/2023 | Park | G06N 3/049 706/15 |
| 2023/0195363 | A1 * | 6/2023 | Kim | G06F 3/0604 711/154 |
| 2024/0008292 | A1 * | 1/2024 | Lee | H10N 70/883 |
| 2024/0202510 | A1 * | 6/2024 | Amer | G06N 3/065 |
| 2024/0265247 | A1 * | 8/2024 | Choi | G06N 3/049 |
| 2024/0312516 | A1 * | 9/2024 | Kim | G11C 13/0028 |
| 2025/0182822 | A1 * | 6/2025 | Choi | G11C 11/223 |

FOREIGN PATENT DOCUMENTS

| | | | |
|---|---|---|---|
| KR | 10-2018-0086152 | A | 7/2018 |
| KR | 10-2018-0115941 | A | 10/2018 |
| KR | 10-2002212 | B1 | 7/2019 |
| KR | 10-2019-0103610 | A | 9/2019 |
| KR | 10-2019-0121048 | A | 10/2019 |
| KR | 10-2112393 | B1 | 5/2020 |
| KR | 10-2021-0022869 | A | 3/2021 |
| KR | 10-2021-0075542 | A | 6/2021 |

* cited by examiner

700

3D NEUROMORPHIC SYSTEM AND OPERATING METHOD THEREOF

CROSS-REFERENCE TO RELATED APPLICATION

This application is a National Stage Entry of PCT International Application No. PCT/KR2022/008835, which was filed on Jun. 22, 2022, and which claims priority to Korean Patent Application No. 10-2021-0082091, filed on Jun. 24, 2021 in the Korean Intellectual Property Office, the invention of which is incorporated herein by reference.

TECHNICAL FIELD

The present invention relates to a 3D neuromorphic system and a method of operating the same, and more particularly to a technology of independently connecting a plurality of neuromorphic elements three-dimensionally laminated on a Complementary Metal-Oxide Semiconductor (CMOS) wafer through an interconnection layer and selectively driving and testing the plural neuromorphic elements with pulses generated and transmitted from the CMOS wafer.

BACKGROUND ART

Recently, research on neuromorphic systems as low-power devices has been attracting attention in the semiconductor industry to overcome the limitations of large-capacity data processing using the von Neumann method.

The human brain can perform memory, calculation, reasoning and learning simultaneously and in real time with a power of about 20 W.

Resistive Random Access Memory (RRAM), a next-generation memory device, is being studied extensively as a neuromorphic device that replicates this brain function with electronic devices.

In an era where IoT-based large-capacity data processing is essential, new technologies capable of overcoming the limitations of data processing methods and power consumption are essential due to the bottleneck that occurs in the existing von Neumann-type computing structure.

Accordingly, new technologies related to neuromorphic systems that imitate the human brain, which has excellent energy efficiency and structure when analyzing and processing data, are being proposed, and are being studied in a variety of ways in terms of materials, devices, and circuits.

As a neuromorphic device for such neuromorphic systems, resistance change memory device RRAM is advantageous for high integration, and much research thereinto is being conducted.

RRAM devices have a metal-insulator-metal capacitor structure and are driven by a mechanism in which the electrical characteristics of the device change as the resistance in an insulator between metals changes.

It can be operated with a simple structure of 2 terminals, so when expanding to an array, it can be advantageous for semiconductor flows, where high integration of devices is important, by scaling down.

Previous research institutes have integrated switching devices such as RRAM and Conductive Bridging Random Access Memory (CBRAM) in a Back End Of Line (BEOL) process after a lower Front End Of Line (FEOL), so have shown the possibility of applying BEOL integrated devices based on a Complementary Metal-Oxide Semiconductor (CMOS) process.

However, existing technologies focus on researching RRAM array devices or flash array devices as neuromorphic devices that can be applied to neuromorphic systems in hardware.

In addition, intensive research is being conducted to implement neuron networks with low power and high accuracy.

Meanwhile, Test Element Group (TEG) design and application technologies show the limitations of devices that can only be manufactured in the CMOS process and a single process due to process limitations.

DISCLOSURE

Technical Problem

Therefore, the present invention has been made in view of the above problems, and it is one object of the present invention to provide a highly integrated 3D neuromorphic system formed by independently connecting neuromorphic elements of a neuromorphic element array to a Complementary Metal-Oxide Semiconductor (CMOS) wafer, thereby being capable of minimizing leakage current through a sneak path, which is a disadvantage of an existing RRAM array.

It is another object of the present invention to expand the scope of research on neuromorphic neural networks by applying a neuromorphic element not only to an RRAM element but also to other elements.

It is still another object of the present invention to provide a framework for neuromorphic/synaptic yield and performance verification as a test element group (TEG), and the test element group (TEG) and verification circuit designed during the verification process can be used for neuromorphic verification of not only via-integrated elements but also other types of 2terminal and 3terminal elements, providing a new element verification platform.

It is still another object of the present invention to promote research and development of elements that are later implemented in a Back End Of Line (BEOL) process by establishing a process platform integrated into vias and establishing a stable verification system.

It is yet another object of the present invention to provide a 3D neuromorphic system formed by independently connecting the neuromorphic elements 3D laminated on the Complementary Metal-Oxide Semiconductor (CMOS) wafer of the neuromorphic element array through the interconnection layer previously formed on the CMOS wafer, and capable of selectively driving and testing the neuromorphic elements of the neuromorphic element array using pulses generated and transmitted from the CMOS wafer, and method of operating the 3D neuromorphic system.

Technical Solution

In accordance with an aspect of the present invention, the above and other objects can be accomplished by the provision of a 3D neuromorphic system implemented on a Complementary Metal-Oxide Semiconductor (CMOS) wafer, the 3D neuromorphic system including: an element array including a plurality of neuromorphic elements respectively and independently connected to a plurality of interconnection layers formed on the Complementary Metal-Oxide Semiconductor (CMOS) wafer; a synaptic pulse generator configured to generate at least one synaptic pulse to generate synaptic characteristics in the plural neuromorphic elements; and a controller configured to generate a control signal for controlling generation of the at least one synaptic pulse and to control the at least one synaptic pulse generated in the plural neuromorphic elements to sequentially applied.

According to an embodiment of the present invention, the 3D neuromorphic system may further include a measurer configured to measure a conductance of the synaptic characteristics in the neuromorphic element, in which synaptic characteristics are generated based on the sequentially applied at least one synaptic pulse, among the plural neuromorphic elements.

The measurer may individually or simultaneously measure conductance of the plural neuromorphic elements as each of the plural neuromorphic elements is independently connected to the Complementary Metal-Oxide Semiconductor (CMOS) wafer.

The controller may control electrical signals related to conductance of the plural neuromorphic elements to be transmitted to the measurer while controlling the generated at least one synaptic pulse to be respectively and sequentially applied to the plural neuromorphic elements by sequentially switching switches respectively connected to the plural neuromorphic elements.

The synaptic pulse generator may include: a pulse generator; a pulse controller; and a pulse output, wherein the pulse generator is implemented as a ring oscillator using a plurality of inverters and generates a pulse with a pulse reference signal based on the plural inverters, and the pulse controller controls a duty magnification of the pulse reference signal or a frequency magnification of the pulse reference period signal based on the control signal.

When the control signal is a pulse duty control signal that sequentially increases pulse duty, the pulse controller may control a pulse with a duty magnification sequentially increased based on the pulse duty control signal to be output through the pulse output.

When the control signal is a pulse frequency control signal that sequentially reduces a pulse frequency, the pulse controller may control a pulse with a frequency magnification sequentially reduced based on the pulse frequency control signal to be output through the pulse output.

The synaptic pulse generator may generate the at least one synaptic pulse as one pulse among a positive pulse and a negative pulse.

Each of the plural neuromorphic elements may include: a bottom electrode independently connected to a ground of the Complementary Metal-Oxide Semiconductor (CMOS) wafer based on each of the plural interconnection layers; a switching layer formed on the bottom electrode; and a top electrode formed on the switching layer, and applied with the at least one synaptic pulse by being independently connected to the synaptic pulse generator of the Complementary Metal-Oxide Semiconductor (CMOS) wafer based on each of the plural interconnection layers.

The switching layer may generate the synaptic characteristics based on at least one synaptic pulse applied through the top electrode.

The bottom electrode and the top electrode may be formed of a metal material, and the switching layer may be formed of $HfO_2$.

The bottom electrode may be formed to a thickness of 20 nm, the switching layer may be formed to a thickness of 6 nm to 7 nm, and the top electrode may be formed to a thickness of 100 nm.

In accordance with another aspect of the present invention, provided is a method of operating a 3D neuromorphic system implemented on Complementary Metal-Oxide Semiconductor (CMOS) wafer, the method including: in an element array including a plurality of neuromorphic elements respectively and independently connected to a plurality of interconnection layers formed on the Complementary Metal-Oxide Semiconductor (CMOS) wafer, generating, by a synaptic pulse generator, at least one synaptic pulse to generate synaptic characteristics from each of the plural neuromorphic elements; and generating, by a controller, a control signal for controlling generation of the at least one synaptic pulse and controlling the at least one synaptic pulse generated in the plural neuromorphic elements to sequentially applied.

The method of operating the 3D neuromorphic system according to an embodiment of the present invention may further include: measuring, by a measurer, a conductance of the synaptic characteristics in the neuromorphic element, in which synaptic characteristics are generated based on the sequentially applied at least one synaptic pulse, among the plural neuromorphic elements.

The generating of the control signal and the controlling of the at least one synaptic pulse may include: controlling electrical signals related to conductance of the plural neuromorphic elements to be transmitted to the measurer while controlling the generated at least one synaptic pulse to be respectively and sequentially applied to the plural neuromorphic elements by sequentially switching switches respectively connected to the plural neuromorphic elements.

The generating of the at least one synaptic pulse may include: generating a pulse with a pulse reference signal based on the plural inverters; and controlling a duty magnification of the pulse reference signal or a frequency magnification of the pulse reference period signal based on the control signal.

Advantageous Effects

As apparent above, the present invention can provide a highly integrated 3D neuromorphic system formed by independently connecting neuromorphic elements of a neuromorphic element array to a Complementary Metal-Oxide Semiconductor (CMOS) wafer, thereby being capable of minimizing leakage current through a sneak path, which is a disadvantage of an existing RRAM array.

In addition, the present invention can expand the scope of research on neuromorphic neural networks by applying a neuromorphic element not only to an RRAM element but also to other elements.

In addition, the present invention can provide a framework for neuromorphic/synaptic yield and performance verification as a test element group (TEG), and the test element group (TEG) and verification circuit designed during the verification process can be used for neuromorphic verification of not only via-integrated elements but also other types of 2terminal and 3terminal elements, providing a new element verification platform.

In addition, the present invention can promote research and development of elements that are later implemented in a Back End Of Line (BEOL) process by establishing a process platform integrated into vias and establishing a stable verification system.

The present invention can provide a 3D neuromorphic system formed by independently connecting the neuromorphic elements 3D laminated on the Complementary Metal-Oxide Semiconductor (CMOS) wafer of the neuromorphic element array through the interconnection layer previously formed on the CMOS wafer, and capable of selectively driving and testing the neuromorphic elements of the neuromorphic element array using pulses generated and transmitted from the CMOS wafer, and method of operating the 3D neuromorphic system.

BEST MODE

Figure 1:
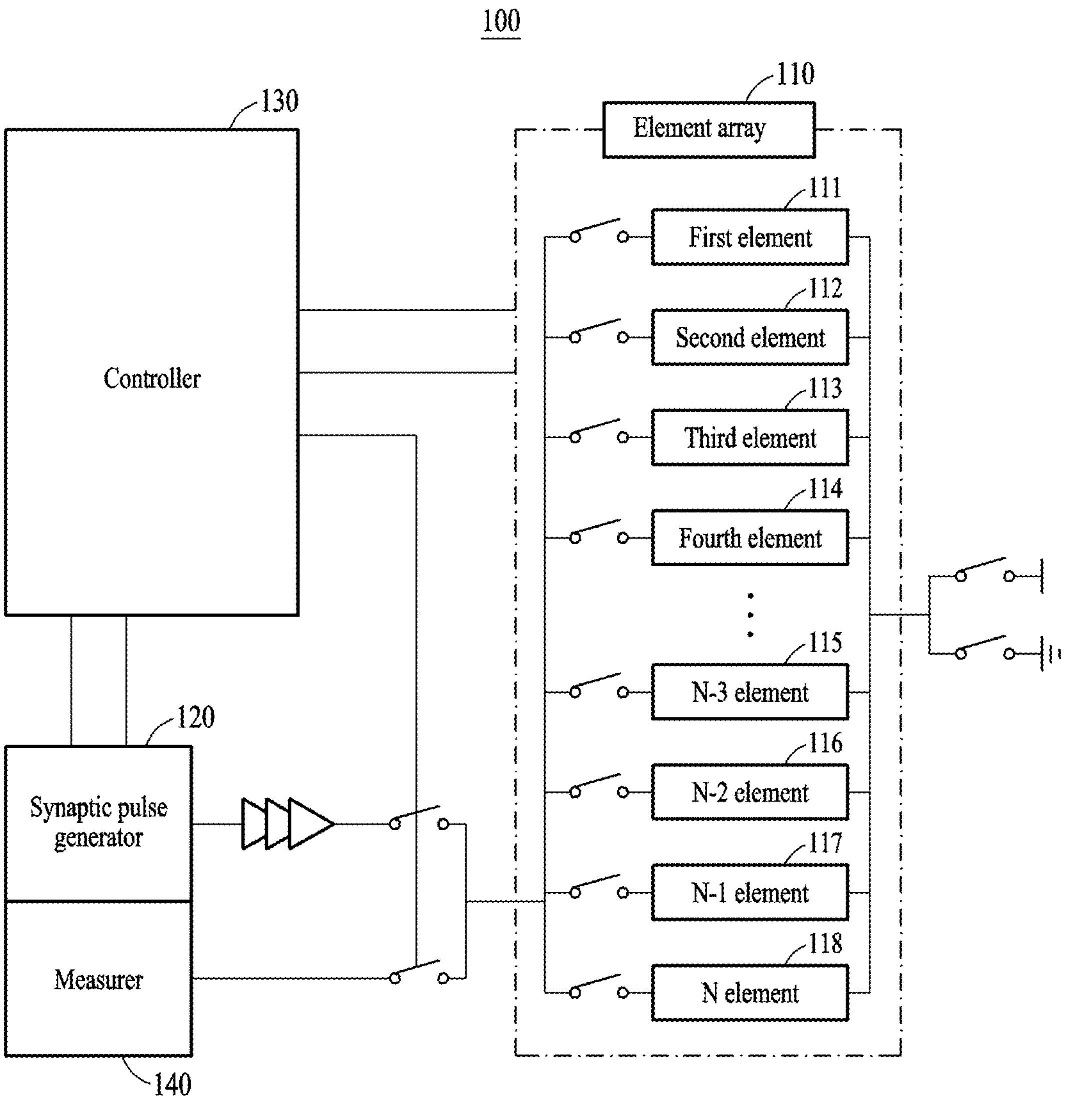
FIG. 1 illustrates a 3D neuromorphic system according to an embodiment of the present invention.

The embodiments will be described in detail herein with reference to the drawings.

However, it should be understood that the present invention is not limited to the embodiments according to the concept of the present invention, but includes changes, equivalents, or alternatives falling within the spirit and scope of the present invention.

In the following description of the present invention, a detailed description of known functions and configurations incorporated herein will be omitted when it may make the subject matter of the present invention unclear.

The terms used in the specification are defined in consideration of functions used in the present invention, and can be changed according to the intent or conventionally used methods of clients, operators, and users. Accordingly, definitions of the terms should be understood on the basis of the entire description of the present specification.

In description of the drawings, like reference numerals may be used for similar elements The singular expressions in the present specification may encompass plural expressions unless clearly specified otherwise in context.

In this specification, expressions such as “A or B” and “at least one of A and/or B” may include all possible combinations of the items listed together.

Expressions such as “first” and “second” may be used to qualify the elements irrespective of order or importance, and are used to distinguish one element from another and do not limit the elements.

It will be understood that when an element (e.g., first) is referred to as being “connected to” or “coupled to” another element (e.g., second), it may be directly connected or coupled to the other element or an intervening element (e.g., third) may be present.

As used herein, “configured to” may be used interchangeably with, for example, “suitable for”, “ability to”, “changed to”, “made to”, “capable of”, or “designed to” in terms of hardware or software.

In some situations, the expression “device configured to” may mean that the device “may do ~” with other devices or components.

For example, in the sentence “processor configured to perform A, B, and C”, the processor may refer to a general purpose processor (e.g., CPU or application processor) capable of performing corresponding operation by running a dedicated processor (e.g., embedded processor) for performing the corresponding operation, or one or more software programs stored in a memory device.

In addition, the expression “or” means “inclusive or” rather than “exclusive or”.

That is, unless otherwise mentioned or clearly inferred from context, the expression “x uses a or b” means any one of natural inclusive permutations.

In the aforementioned embodiments, constituents of the present invention were expressed in a singular or plural form depending upon embodiments thereof.

However, the singular or plural expressions should be understood to be suitably selected depending upon a suggested situation for convenience of description, and the aforementioned embodiments should be understood not to be limited to the disclosed singular or plural forms. In other words, it should be understood that plural constituents may be a singular constituent or a singular constituent may be plural constituents.

While the embodiments of the present invention have been described, those skilled in the art will appreciate that many modifications and changes can be made to the present invention without departing from the spirit and essential characteristics of the present invention.

Therefore, it should be understood that there is no intent to limit the invention to the embodiments disclosed, rather, the invention is to cover all modifications, equivalents, and alternatives falling within the spirit and scope of the invention as defined by the claims.

FIG. 1 illustrates a 3D neuromorphic system according to an embodiment of the present invention.

FIG. 1 illustrates components of the 3D neuromorphic system according to an embodiment of the present invention.

Referring to FIG. 1, a 3D neuromorphic system 100 according to an embodiment of the present invention includes an element array 110, a synaptic pulse generator 120 and a controller 130.

For example, the 3D neuromorphic system 100 may be a 3D neuromorphic system implemented on a Complementary Metal-Oxide Semiconductor (CMOS) wafer.

The element array 110 according to an embodiment of the present invention includes a plurality of neuromorphic elements respectively and independently connected to a plurality of interconnection layers formed on the CMOS wafer.

For example, the plural neuromorphic elements include a first element (111), a second element 112, a third element 113, a fourth element 114, an N−3 element 115, an N−2 element 116, an N−1 element 117 and an N element 118. Here, N may be any number.

For example, the plurality of neuromorphic elements may be formed by, after forming an interconnection layer connected to the CMOS wafer, forming a bottom electrode, which may be independently connected to the CMOS wafer, as a bottom line, forming a switching layer on the bottom electrode, and forming a top electrode, which may be independently connected to the CMOS wafer, as an upper line on an area where the switching layer is etched.

The process of forming the plural neuromorphic elements is described in more detail with reference to FIGS. 2A to 2*d*

According to an embodiment of the present invention, the synaptic pulse generator 120 may generate at least one synaptic pulse to generate synaptic characteristics in the plural neuromorphic elements.

For example, the synaptic pulse generator 120 may include a pulse generator, a pulse controller and a pulse output.

The operation of the synaptic pulse generator 120 is described in more detail with reference to FIGS. 3 and 4.

According to an embodiment of the present invention, the synaptic pulse generator 120 generate at least one synaptic pulse into one pulse of a positive pulse and a negative pulse.

For example, the duty and frequency of the positive pulse and the negative pulse may be controlled.

According to an embodiment of the present invention, the controller 130 may generate a control signal for controlling the generation of at least one synaptic pulse and may control the at least one synaptic pulse generated in the plural neuromorphic elements to be sequentially applied.

That is, the controller 130 may control the plural neuromorphic elements to be sequentially switched in a programmed order using an automated test sequence control function for automated measurement of the element array 110 including the plural neuromorphic elements.

According to an embodiment of the present invention, the 3D neuromorphic system 100 may further include a measurer 140.

For example, the measurer 140 may measure the conductance for synaptic characteristics in the neuromorphic element, in which synaptic characteristics are generated based on at least one synaptic pulse sequentially applied, among the plural neuromorphic elements.

In addition, the measurer may individually or simultaneously measure the conductance of the plural neuromorphic elements as each of the plural neuromorphic elements is independently connected to the Complementary Metal-Oxide Semiconductor (CMOS) wafer.

According to an embodiment of the present invention, the controller 130 may control the generated at least one synaptic pulse to be respectively and sequentially applied to the plural neuromorphic elements by sequentially switching the switches respectively connected to the plural neuromorphic elements of the element array 110 and, at the same time, may control electrical signals related to conductance of the plural neuromorphic elements to be transmitted to the measurer 140.

That is, the controller 130 switches sequentially the switches in the order, in which the switches are programmed, for automated measurement of the element array 110, thereby controlling the plural devices included in the element array 110 to be sequentially connected to the synaptic pulse generator 120 and the measurer 140.

According to an embodiment of the present invention, the 3D neuromorphic system 100 may implement the operation characteristics of the 3D neuromorphic system 100 according to a method of operating the same.

Meanwhile, the 3D neuromorphic system 100 may be referred to as a Test Element Group (TEG).

For example, the 3D neuromorphic system 100 may formed by stacking the plural neuromorphic elements on the CMOS wafer in three dimensions, and each of the plural neuromorphic elements may be independently connected to the CMOS wafer.

The CMOS wafer may include the element array 110, the synaptic pulse generator 120, the controller 130 and the measurer 140, thereby implemented as the 3D neuromorphic system 100. The 3D neuromorphic system 100 may operate as a Test Element Group (TEG), thereby verifying the synapse characteristics of the element array 110.

That is, the present invention may provide a framework for neuromorphic/synaptic yield and performance verification as a test element group (TEG), and a test element group (TEG) and verification circuit designed during a verification process may be used for neuromorphic verification of not only via-integrated devices but also other types of 2terminal and 3terminal devices, providing a new element verification platform.

In addition, the present invention can promote research and development of elements that are later implemented in a Back End Of Line (BEOL) process by establishing a process platform integrated into vias and establishing a stable verification system.

In addition, the present invention can provide a 3D neuromorphic system formed by independently connecting the neuromorphic elements 3D laminated on the Complementary Metal-Oxide Semiconductor (CMOS) wafer of the neuromorphic element array through the interconnection layer previously formed on the CMOS wafer, and capable of selectively driving and testing the neuromorphic elements of the neuromorphic element array using pulses generated and transmitted from the CMOS wafer, and method of operating the 3D neuromorphic system.

FIGS. 2A to 2*d* are drawings to explain the element formation process of an element array in a 3D neuromorphic system according to an embodiment of the present invention.

Figure 2A:
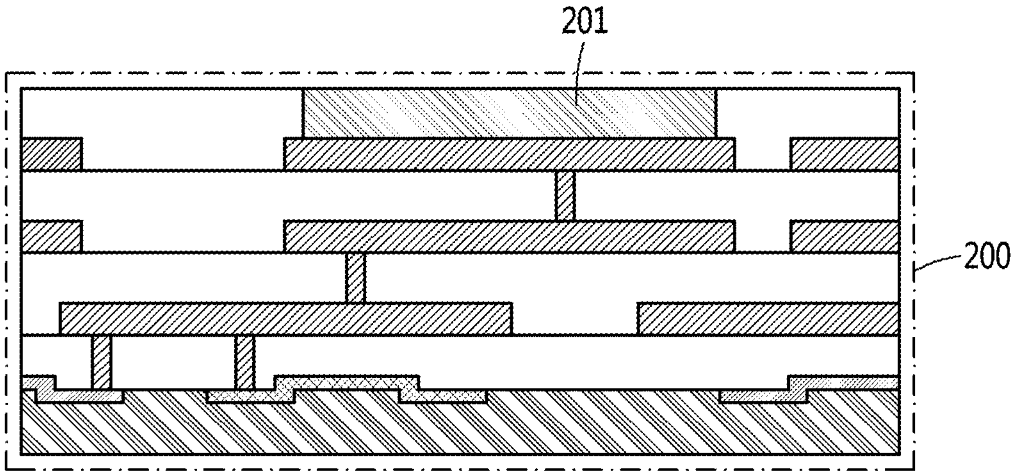
FIGS. 2A to 2D are drawings to explain the element formation process of an element array in a 3D neuromorphic system according to an embodiment of the present invention.

FIG. 2A illustrates the process of forming an interconnection layer during the process of forming a 3D neuromorphic element in the 3D neuromorphic system according to an embodiment of the present invention.

Referring to FIG. 2A, an interconnection layer 201 is formed inside the CMOS wafer 200, and the interconnection layer 201 serves to interconnect a 3D neuromorphic element and the CMOS wafer 200.

Figure 2B:
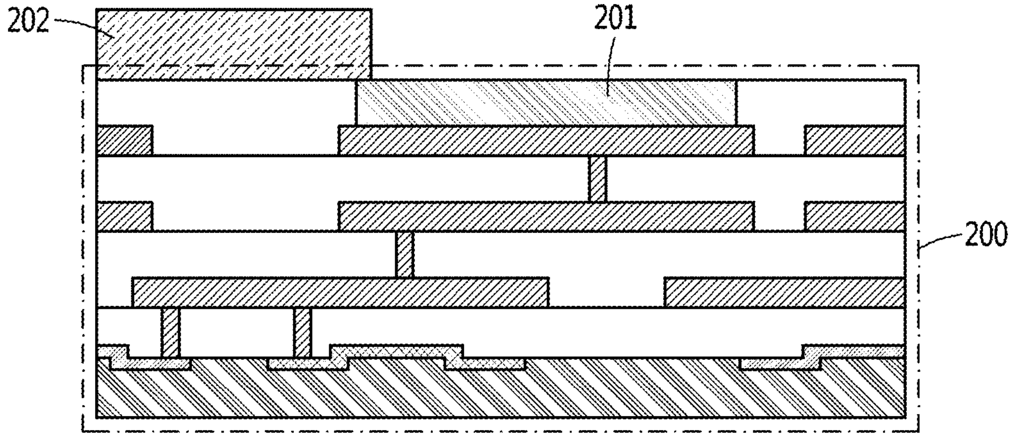

FIG. 2B illustrates a process of forming a Bottom Electrode (BE) during the process of forming a 3D neuromorphic element in the 3D neuromorphic system according to an embodiment of the present invention.

Referring to FIG. 2B, a bottom electrode 202, which can be independently connected to the CMOS wafer 200, is formed through the interconnection layer 201.

For example, the bottom electrode 202 may be referred to as a bottom line.

According to an embodiment of the present invention, the bottom electrode 202 may be independently connected to the ground of the CMOS wafer based on the interconnection layer 201.

For example, the bottom electrode 202 may be formed of a metal material, and the metal material may include Pt.

Figure 2C:
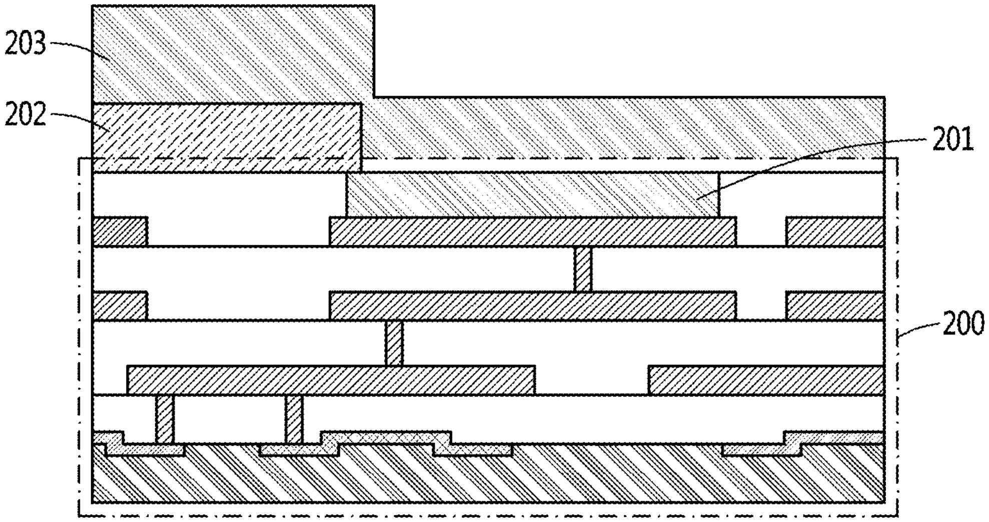

FIG. 2C illustrates a process of forming a switching layer during the formation process of the 3D neuromorphic element in the 3D neuromorphic system according to an embodiment of the present invention.

Referring to FIG. 2C, a switching layer 203 may be formed on the bottom electrode 202, and the switching layer 203 may be made of $HfO_2$.

The switching layer 203 is a switching layer of a Resistive Random Access Memory (RRAM) and may generate synaptic characteristics based on a synaptic pulse applied through a top electrode.

Figure 2D:
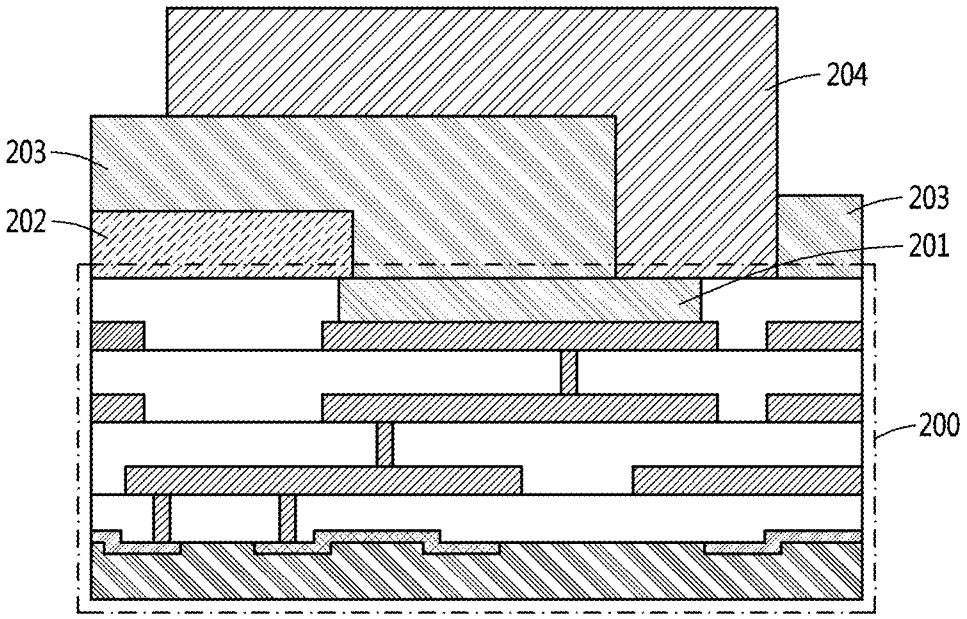

FIG. 2*d* illustrates a process of forming a Top Electrode (TE) during the formation process of the 3D neuromorphic element in the 3D neuromorphic system according to an embodiment of the present invention.

Referring to FIG. 2*d*, the switching layer 203 corresponding to an area, where a top electrode 204 is connected to the lower CMOS wafer 200, is etched, and then the top electrode 204 is formed on the etched area.

For example, the top electrode 204 may be formed of a metal material, and the metal material may include Ag.

According to an embodiment of the present invention, the top electrode 204 may be formed on the switching layer, and may be independently connected to a synaptic pulse generator of the CMOS wafer 200 based on the interconnection layer 201, so that at least one synaptic pulse can be applied.

For example, the neuromorphic element may refer to an RRAM element laminated in a three-dimensional stack on the CMOS wafer 200.

Figure 3:
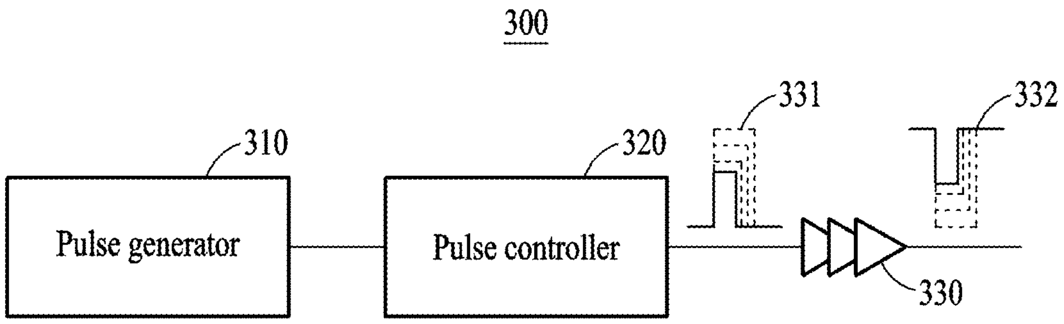
FIGS. 3 and 4 are drawings to explain a synaptic pulse generator of the 3D neuromorphic system according to an embodiment of the present invention.
Figure 4:
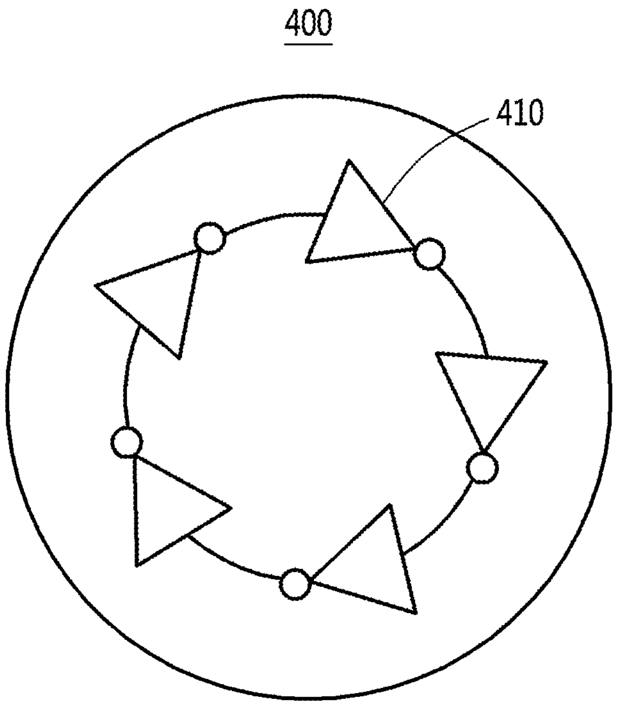

FIGS. 3 and 4 are drawings to explain a synaptic pulse generator of the 3D neuromorphic system according to an embodiment of the present invention.

FIG. 3 illustrates components of the synaptic pulse generator according to an embodiment of the present invention.

Referring to FIG. 3, a synaptic pulse generator 300 according to an embodiment of the present invention includes a pulse generator 310, a pulse controller 320 and a pulse output 330.

For example, the pulse generator 310 may be implemented as a ring oscillator using a plurality of inverters and may generate pulses with a pulse reference signal based on the plural inverters.

According to an embodiment of the present invention, the pulse controller 320 controls a duty magnification of a pulse reference signal or a frequency magnification of a pulse reference period based on a control signal transmitted from the controller of the 3D neuromorphic system.

Specifically, when a control signal is a pulse duty control signal that sequentially increases pulse duty, the pulse controller 320 may control pulses with duty magnification sequentially increased based on the pulse duty control signal to be output through the pulse output 330.

For example, when duty magnification is increased, the number of pulse signals may be reduced during the same time.

In addition, when a control signal is a pulse frequency control signal that sequentially reduces pulse frequency, the pulse controller 320 may control pulses with frequency magnification sequentially reduced based on the pulse frequency control signal to be output through the pulse output 330.

For example, when the frequency (duty) magnification is reduced, the frequency of pulse signals may be reduced during the same time.

For example, the pulse output 330 may output one synaptic pulse signal of the positive pulse 331 and the negative pulse 332, but the duty and frequency of the synaptic pulse signal may be controlled.

That is, a synaptic pulse generator 300 may generate and control a pulse capable of producing a synaptic response using the pulse generator 310 and the pulse controller 320 and output it through the pulse output 330.

According to an embodiment of the present invention, the synaptic pulse generator 300 may control the pulse amplitude, pulse width, pulse frequency and pulse number to change the characteristics of neuromorphic elements.

In addition, the synaptic pulse generator 300 may change the characteristics of the neuromorphic elements by generating a positive pulse and a negative pulse.

FIG. 4 illustrates a pulse generator of the synaptic pulse generator according to an embodiment of the present invention in more detail.

Referring to FIG. 4, a pulse generator 400 may be implanted as a ring oscillator. It may be designed as an oscillator using a plurality of inverters 410 that have the characteristic of outputting 1 when 0 is input.

The number of the inverters 410 is connected to an odd number, and the pulse generator 400 repeatedly and continuously oscillates 1 and 0 when the inverters 410 oscillate, but generates pulses using Resistive-Capacitive (RC) delay for the pulse period.

Figure 5A:
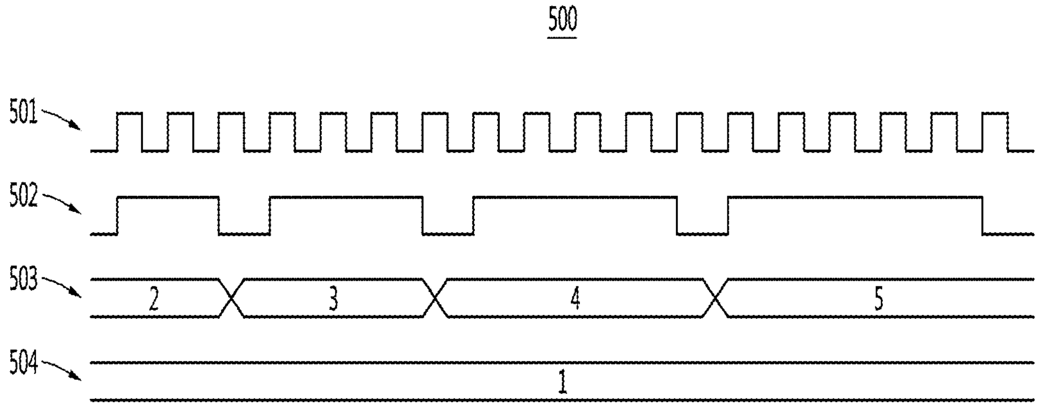
FIGS. 5A and 5B are drawings to explain timing diagrams related to control of synaptic pulses in the 3D neuromorphic system according to an embodiment of the present invention.
Figure 5B:
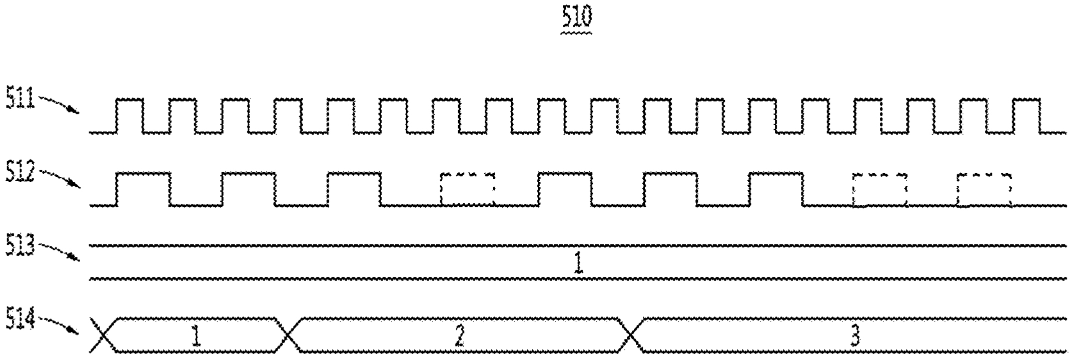

FIGS. 5A and 5B are drawings to explain timing diagrams related to control of synaptic pulses in the 3D neuromorphic system according to an embodiment of the present invention.

FIG. 5A illustrates a timing diagram related to duty control of synaptic pulses in the 3D neuromorphic system according to an embodiment of the present invention.

A timing diagram 500 of FIG. 5A shows the timing of a pulse reference signal 501, a controlled pulse signal 502, a pulse duty control signal 503 and a pulse frequency control signal 504.

Specifically, the pulse reference signal 501 may be generated from a pulse generator and may be formed into the controlled pulse signal 502 through a pulse controller inside an integrated circuit.

For example, when the pulse duty control signal 503 is input as 10 bits, the pulse controller is designed so that the period of the pulse reference signal 501 is formed into a controlled pulse signal 502 with a period of N times.

That is, when the pulse duty control signal 503 is 2, 3, or 4, the number of pulse signals may decrease based on the same time as the period of the controlled pulse signal 502 increases.

Here, since the pulse frequency control signal 504 is the same, it can be confirmed that there is no change in the frequency-related characteristics of the controlled pulse signal 502.

FIG. 5B illustrates a timing diagram related to frequency control of synaptic pulses in the 3D neuromorphic system according to an embodiment of the present invention.

A timing diagram 510 of FIG. 5B shows the timing of a pulse reference signal 511, a controlled pulse signal 512, a pulse duty control signal 513 and a pulse frequency control signal 514.

Specifically, the pulse reference signal 511 may be generated from a pulse generator and may be formed into the controlled pulse signal 512 through a pulse controller inside an integrated circuit.

For example, when the pulse frequency control signal 514 is input as 10 bits, the pulse controller is designed so that the frequency of the pulse reference signal 511 is formed into a controlled pulse signal 512 with a frequency of 1/N times.

Here, since the pulse duty control signal 513 is the same, it can be confirmed that there is no change in the duty-related characteristics of the controlled pulse signal 512.

That is, when the pulse frequency control signal 514 is 2, 3, and 4, the signal generation frequency changes depending on the frequency of the controlled pulse signal 502.

Figure 6A:
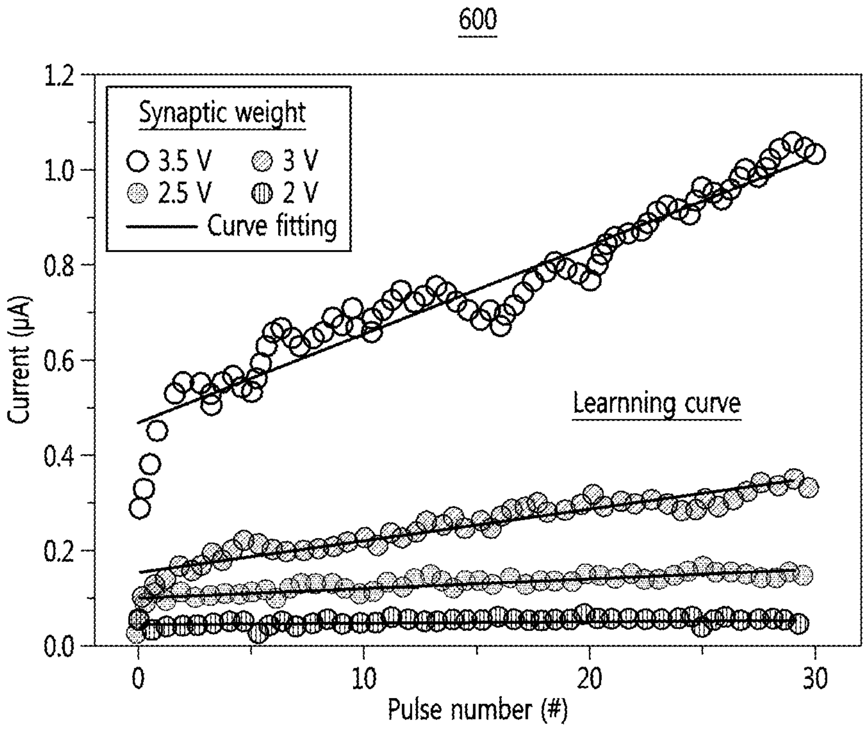
FIGS. 6A and 6B are drawings to explain operation characteristics of the 3D neuromorphic system according to an embodiment of the present invention.
Figure 6B:
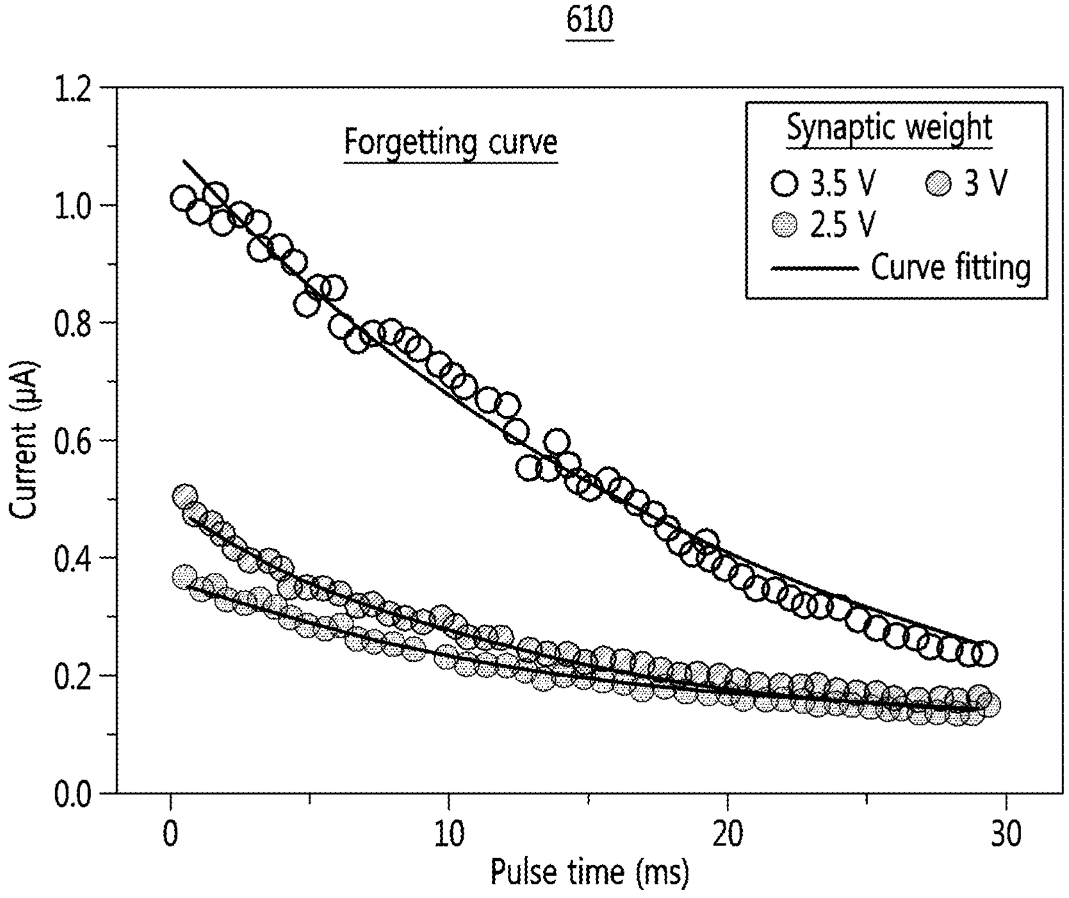

FIGS. 6A and 6B are drawings to explain operation characteristics of the 3D neuromorphic system according to an embodiment of the present invention.

FIGS. 6A and 6B show changes in electrical characteristics of the 3D neuromorphic system according to an embodiment of the present invention.

A graph 600 of FIG. 6A illustrates a learning curve according to changes in the magnitude of voltage and number of pulses related to synaptic characteristics.

A graph 610 of FIG. 6B illustrates a forgetting curve according to changes in the magnitude of voltage and number of pulses related to synaptic characteristics.

the characteristic measurement result of an element array when selectively applied to a plurality of neuromorphic elements consisting of 12 elements in a horizontal direction (row) and 14 elements in a vertical direction (column).

a neuromorphic element to which synaptic pulses are applied; and a neuromorphic element to which synaptic pulses are not applied.

In the 3D neuromorphic system according to an embodiment of the present invention, the controller may sequentially select neuromorphic elements of the element array and measure the characteristics of the element array using measured voltage and current.

Figure 7:
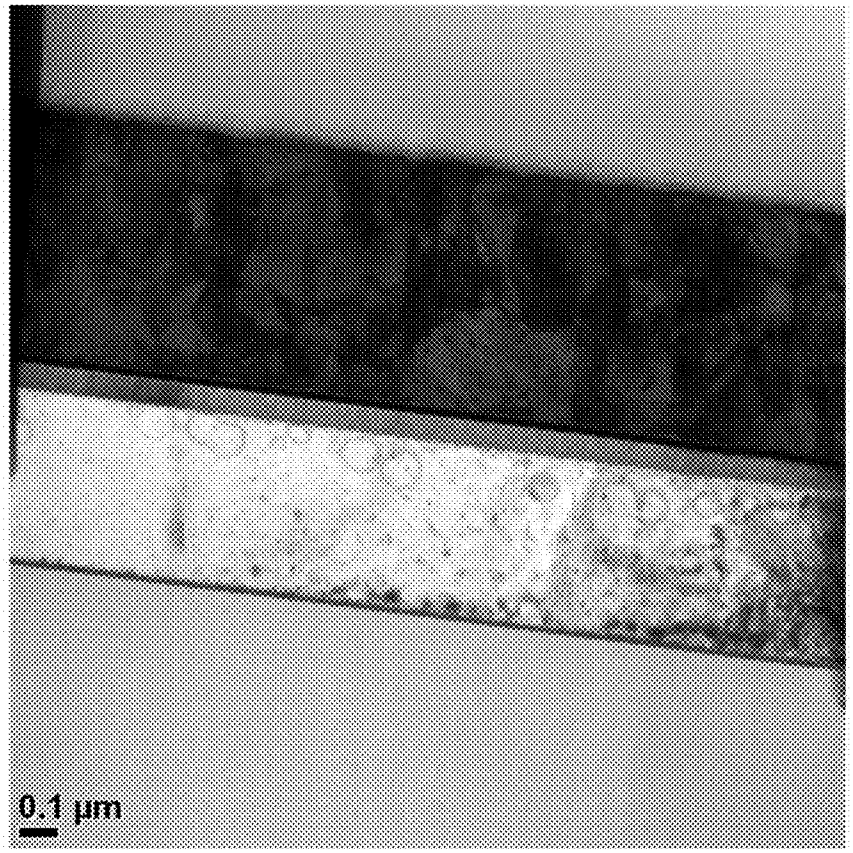
FIG. 7 is a drawing to explain an element structure of an element array in the 3D neuromorphic system according to an embodiment of the present invention.

FIG. 7 is a drawing to explain an element structure of an element array in the 3D neuromorphic system according to an embodiment of the present invention.

FIG. 7 illustrates an electron microscope image of an element structure of an element array in the 3D neuromorphic system according to an embodiment of the present invention.

Referring to FIG. 7, an element of the element array in the 3D neuromorphic system according to an embodiment of the present invention is a neuromorphic element, and an RRAM element may be used.

An RRAM element structure includes a top electrode, a switching layer and a bottom electrode. The top electrode may be formed using Ag, the switching layer may be formed using $HfO_2$, and the bottom electrode may be formed using Pt.

For example, the bottom electrode may be formed to a thickness of 20 nm, the switching layer may be formed to a thickness of 6 nm to 7 nm, and the top electrode may be formed to a thickness of 100 nm.

Figure 8:
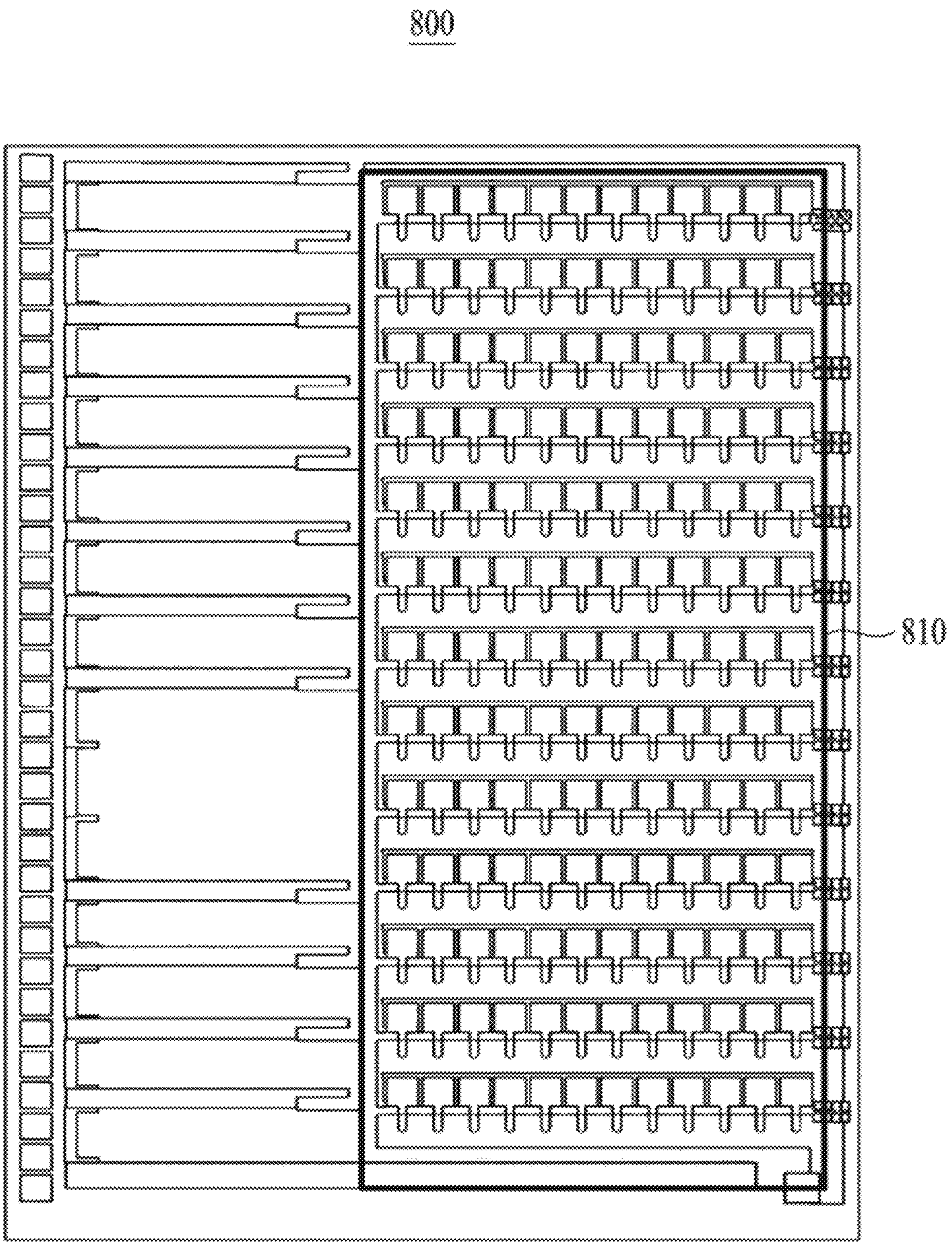
FIG. 8 illustrates an optical image of an element array in the 3D neuromorphic system according to an embodiment of the present invention.

FIG. 8 illustrates an optical image of an element array in the 3D neuromorphic system according to an embodiment of the present invention.

Referring to FIG. 8, in the 3D neuromorphic system 800 according to an embodiment of the present invention, an element array 810 is formed, and each of a plurality of neuromorphic elements in the element array 810 is independently connected to a CMOS wafer.

For example, the element array 810 may have an area of 100 $um^2$ and may be designed in the form of 12*14 array.

Since the element array 810 is connected to a bottom CMOS, a top electrode is independently connected to an area where a pulse comes out, and the bottom electrode is connected to the ground.

In the element array 810 according to an embodiment of the present invention, the top electrode, which is not in the form of a typical cross-bar array, is respectively connected to the CMOS wafer, allowing pulses to be applied independently.

In addition, the bottom electrode is independently connected to an interconnection layer and falls into a ground pad.

Accordingly, a 3D neuromorphic system 800 generates synaptic pulses through a CMOS wafer and transmits them to the top electrode, enabling individual characteristic verification and simultaneous verification of multiple elements.

That is, the present invention can provide a highly integrated 3D neuromorphic system by independently connecting neuromorphic elements of the neuromorphic element array to the Complementary Metal-Oxide Semiconductor (CMOS) wafer to minimize leakage current through a sneak path which is a disadvantage of a conventional RRAM array.

Figure 9:
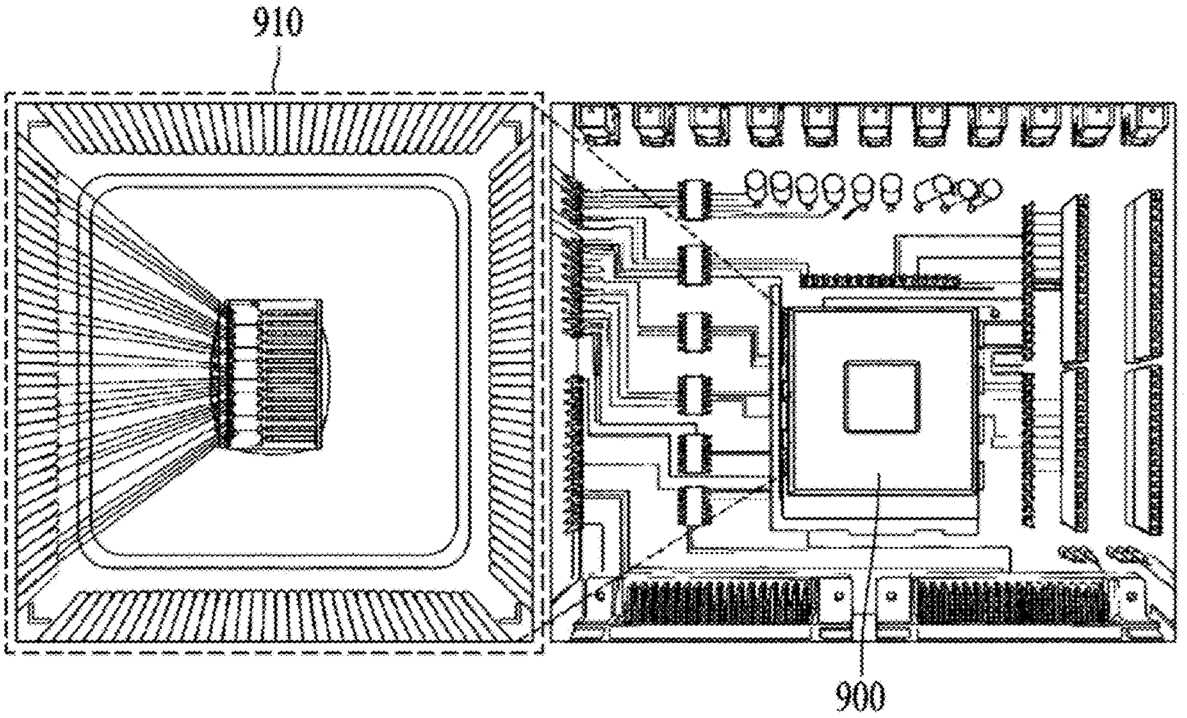
FIG. 9 is a drawing to explain the one-chip form of a 3D neuromorphic system according to an embodiment of the present invention.

FIG. 9 is a drawing to explain the one-chip form of a 3D neuromorphic system according to an embodiment of the present invention.

FIG. 9 illustrates a 3D neuromorphic system according to an embodiment of the present invention that can be implanted in one-chip form.

FIG. 9 illustrates a one-chip image 900 of the 3D neuromorphic system and an expanded internal image 910 thereof.

For example, the expanded internal image 910 shows how the element array shown in FIG. 8 is implemented.

Figure 10:
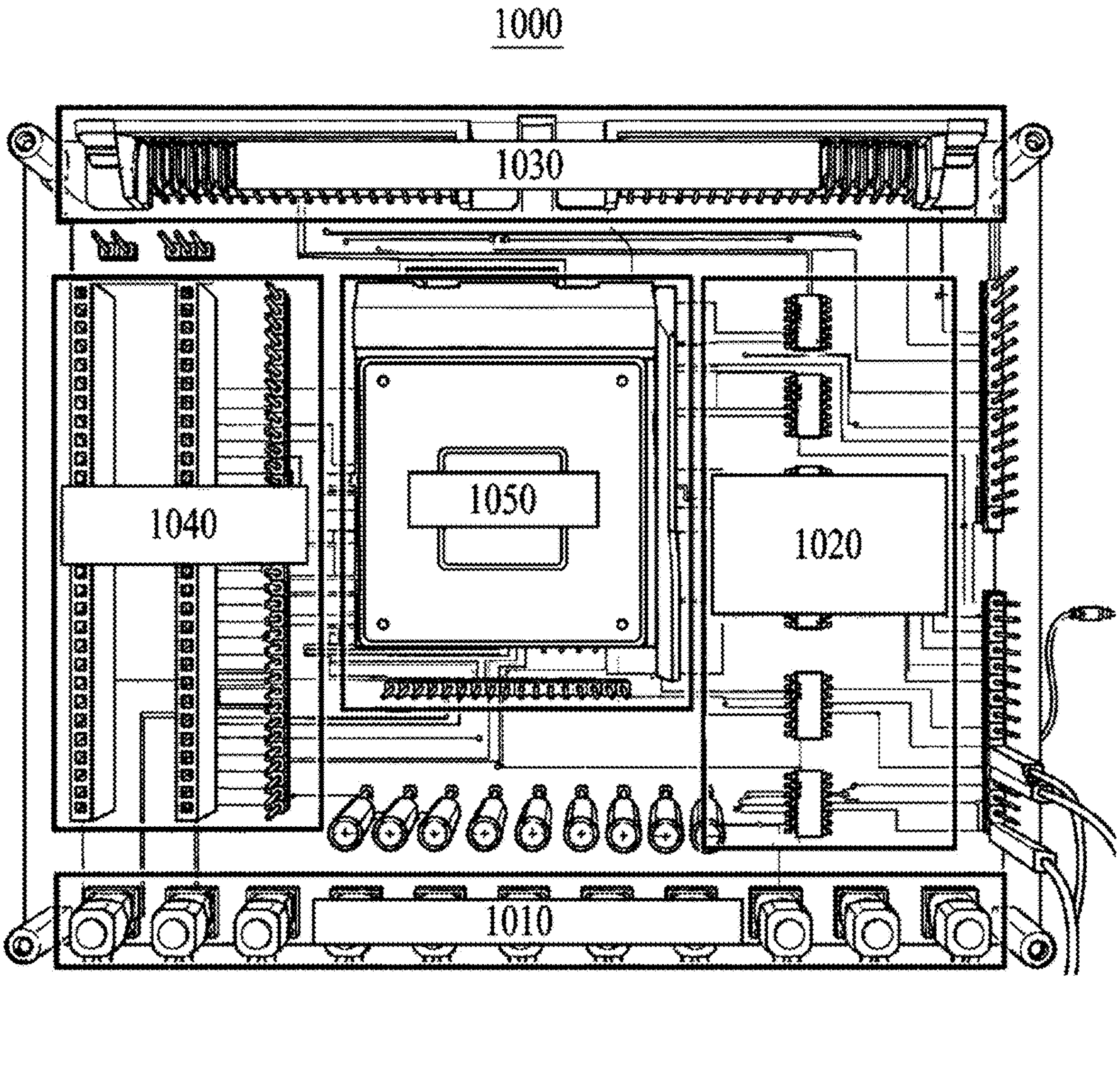
FIG. 10 is a drawing to explain the configuration of a Printed Circuit Board (PCB) board to which the 3D neuromorphic system according to an embodiment of the present invention is applied.

FIG. 10 is a drawing to explain the configuration of a Printed Circuit Board (PCB) board to which the 3D neuromorphic system according to an embodiment of the present invention is applied.

Referring to FIG. 10, the configuration 1000 of Printed Circuit Board (PCB) board includes a power supplier 1010, an analog buffer and digital level converter 120, a measurement equipment connector 130, a signal jumper 140 and an integrated circuit 150 of a 3D neuromorphic system.

The power supplier 1010 performs the role of supplying and measuring power.

The analog buffer and digital level converter 120 shift the level to convert the voltage level of a digital signal and perform a buffering role for an internal analog signal.

The measurement equipment connector 130 serves as a connector for digital input inside the integrated circuit.

The signal jumper 140 serves as a jumper to check the signals of digital input and output.

The integrated circuit 150 of the 3D neuromorphic system corresponds to the one-chip of the 3D neuromorphic system illustrated in FIG. 9.

In the Printed Circuit Board (PCB) board applied to the 3D neuromorphic system, the 3D neuromorphic system is completed in a one-chip form, enabling stable characteristic confirmation. In addition, by controlling the neuromorphic elements based on the CMOS wafer, automation may be advantageous due to the ease of measuring element characteristics.

Therefore, the present invention can expand the scope of research on neuromorphic neural networks by applying the neuromorphic element not only to the RRAM element but also to other elements.

In addition, the present invention can provide a framework for neuromorphic/synaptic yield and performance verification as a test element group (TEG), and the test element group (TEG) and verification circuit designed during the verification process can be used for neuromorphic verification of not only via-integrated elements but also other types of 2terminal and 3terminal elements, providing a new element verification platform.

Although the present invention has been described with reference to limited embodiments and drawings, it should be understood by those skilled in the art that various changes and modifications may be made therein. For example, the described techniques may be performed in a different order than the described methods, and/or components of the described systems, structures, devices, circuits, etc., may be combined in a manner that is different from the described method, or appropriate results may be achieved even if replaced by other components or equivalents.

Therefore, other embodiments, other examples, and equivalents to the claims are within the scope of the following claims.

The invention claimed is:

1. A 3D neuromorphic system implemented on a Complementary Metal-Oxide Semiconductor (CMOS) wafer, the 3D neuromorphic system comprising:

an element array comprising a plurality of neuromorphic elements respectively and independently connected to a plurality of interconnection layers formed on the Complementary Metal-Oxide Semiconductor (CMOS) wafer;

a synaptic pulse generator configured to generate at least one synaptic pulse to generate synaptic characteristics in the plural neuromorphic elements; and a controller configured to generate a control signal for controlling generation of the at least one synaptic pulse and to control the at least one synaptic pulse generated in the plural neuromorphic elements to sequentially applied.

2. The 3D neuromorphic system according to claim 1, further comprising: a measurer configured to measure a conductance of the synaptic characteristics in the neuromorphic element, in which synaptic characteristics are generated based on the sequentially applied at least one synaptic pulse, among the plural neuromorphic elements.

3. The 3D neuromorphic system according to claim 2, wherein the measurer individually or simultaneously measures conductance of the plural neuromorphic elements as each of the plural neuromorphic elements is independently connected to the Complementary Metal-Oxide Semiconductor (CMOS) wafer.

4. The 3D neuromorphic system according to claim 2, wherein the controller controls electrical signals related to conductance of the plural neuromorphic elements to be transmitted to the measurer while controlling the generated at least one synaptic pulse to be respectively and sequentially applied to the plural neuromorphic elements by sequentially switching switches respectively connected to the plural neuromorphic elements.

5. The 3D neuromorphic system according to claim 1, wherein the synaptic pulse generator comprises: a pulse generator; a pulse controller; and a pulse output, wherein the pulse generator is implemented as a ring oscillator using a plurality of inverters and generates a pulse with a pulse reference signal based on the plural inverters, and the pulse controller controls a duty magnification of the pulse reference signal or a frequency magnification of the pulse reference period signal based on the control signal.

6. The 3D neuromorphic system according to claim 5, wherein, when the control signal is a pulse duty control signal that sequentially increases pulse duty, the pulse controller controls a pulse with a duty magnification sequentially increased based on the pulse duty control signal to be output through the pulse output.

7. The 3D neuromorphic system according to claim 5, wherein, when the control signal is a pulse frequency control signal that sequentially reduces a pulse frequency, the pulse controller controls a pulse with a frequency magnification sequentially reduced based on the pulse frequency control signal to be output through the pulse output.

8. The 3D neuromorphic system according to claim 5, wherein the synaptic pulse generator generates the at least one synaptic pulse as one pulse among a positive pulse and a negative pulse.

9. The 3D neuromorphic system according to claim 1, wherein each of the plural neuromorphic elements comprises:

a bottom electrode independently connected to a ground of the Complementary Metal-Oxide Semiconductor (CMOS) wafer based on each of the plural interconnection layers;

a switching layer formed on the bottom electrode; and a top electrode formed on the switching layer, and applied with the at least one synaptic pulse by being independently connected to the synaptic pulse generator of the Complementary Metal-Oxide Semiconductor (CMOS) wafer based on each of the plural interconnection layers.

10. The 3D neuromorphic system according to claim 9, wherein the switching layer generates the synaptic characteristics based on at least one synaptic pulse applied through the top electrode.

11. The 3D neuromorphic system according to claim 9, wherein the bottom electrode and the top electrode are formed of a metal material, and the switching layer is formed of $HfO_2$.

12. The 3D neuromorphic system according to claim 11 wherein the bottom electrode is formed to a thickness of 20 nm, the switching layer is formed to a thickness of 6 nm to 7 nm, and the top electrode is formed to a thickness of 100 nm.

13. A method of operating a 3D neuromorphic system implemented on Complementary Metal-Oxide Semiconductor (CMOS) wafer, the method comprising:

in an element array comprising a plurality of neuromorphic elements respectively and independently connected to a plurality of interconnection layers formed on the Complementary Metal-Oxide Semiconductor (CMOS) wafer, generating, by a synaptic pulse generator, at least one synaptic pulse to generate synaptic characteristics from each of the plural neuromorphic elements; and generating, by a controller, a control signal for controlling generation of the at least one synaptic pulse and controlling the at least one synaptic pulse generated in the plural neuromorphic elements to sequentially applied.

14. The method according to claim 13, further comprising: measuring, by a measurer, a conductance of the synaptic characteristics in the neuromorphic element, in which synaptic characteristics are generated based on the sequentially applied at least one synaptic pulse, among the plural neuromorphic elements.

15. The method according to claim 14, wherein the generating of the control signal and the controlling of the at least one synaptic pulse comprise:

controlling electrical signals related to conductance of the plural neuromorphic elements to be transmitted to the measurer while controlling the generated at least one synaptic pulse to be respectively and sequentially applied to the plural neuromorphic elements by sequentially switching switches respectively connected to the plural neuromorphic elements.

16. The method according to claim 13, wherein the generating of the at least one synaptic pulse comprises:

generating a pulse with a pulse reference signal based on the plural inverters; and controlling a duty magnification of the pulse reference signal or a frequency magnification of the pulse reference period signal based on the control signal.

* * * * *